United States Patent
Leong et al.

(10) Patent No.: US 12,531,517 B2
(45) Date of Patent: Jan. 20, 2026

(54) HIGH-LINEARITY CASCODE AMPLIFIER AND METHOD THEREOF

(71) Applicant: Realtek Semiconductor Corp., Hsinchu (TW)

(72) Inventors: Poh Boon Leong, Pleasanton, CA (US); Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 476 days.

(21) Appl. No.: 18/316,555

(22) Filed: May 12, 2023

(65) Prior Publication Data

US 2024/0380366 A1    Nov. 14, 2024

(51) Int. Cl.
*H03F 1/22*       (2006.01)
*H03F 1/32*       (2006.01)

(52) U.S. Cl.
CPC .......... *H03F 1/3205* (2013.01); *H03F 1/223* (2013.01); *H03F 2200/219* (2013.01); *H03F 2200/61* (2013.01)

(58) Field of Classification Search
CPC ............. H03F 1/3205; H03F 2200/219; H03F 2200/61; H03F 3/193; H03F 2200/451; H03F 1/223; H03F 1/22; H03F 2200/294
USPC ....................................................... 330/311
See application file for complete search history.

(56) References Cited

U.S. PATENT DOCUMENTS

| | | | | |
|---|---|---|---|---|
| 7,023,272 | B2 * | 4/2006 | Hung | H03F 1/223 330/311 |
| 7,088,356 | B2 * | 8/2006 | Nishimura | H02M 3/07 327/356 |
| 8,018,288 | B2 * | 9/2011 | Duster | H03F 1/0255 330/306 |
| 8,890,623 | B2 * | 11/2014 | Do | H03F 1/223 330/253 |
| 9,964,985 | B1 | 5/2018 | Leong | |
| 10,447,218 | B1 | 10/2019 | Xie | |

* cited by examiner

*Primary Examiner* — Khanh V Nguyen
(74) *Attorney, Agent, or Firm* — McClure, Qualey & Rodack, LLP

(57) ABSTRACT

A cascode amplifier includes a first common-source amplifier (CSA) having a first MOST (metal oxide semiconductor transistor) of a first type configured to receive a first input signal and output a first current to a first node; a first common-gate amplifier (CGA) having a second MOST of the first type and configured to receive the first current from the first node and output a second current to a second node in accordance with a first bias voltage; a first source-follower (SF) having a third MOST of a second type configured to receive a second input signal and output a first voltage at the first node; and a load configured to establish a third voltage at a third node in response to the second current through a DC (direct current) path between the second node and the third node.

20 Claims, 4 Drawing Sheets

HIGH-LINEARITY CASCODE AMPLIFIER AND METHOD THEREOF

BACKGROUND OF THE INVENTION

Field of the Invention

The present invention generally relates to amplifiers and particularly to high-linearity cascode amplifiers.

Description of Related Art

Persons of ordinary skill in the art understand terms and basic concepts related to microelectronics that are used in the context of this disclosure, such as "voltage," "current," "signal," "differential," "single-ended," "capacitor," "inductor," "resistor," "transistor," "MOST (metal-oxide semiconductor transistor)," "PMOST (p-channel metal oxide semiconductor transistor)," "NMOST (n-channel metal oxide semiconductor transistor)," "AC (alternating current)," "DC (direct current)," "DC coupled," "AC coupled," "source," "gate," "drain," "node," "ground node," "power supply node," "bias," "cascode," "common-source amplifier," "common-gate amplifier," "load," "impedance," and "cascode amplifier." Terms and basic concepts like these in the context of this present disclosure are apparent to those of ordinary skill in the art and thus will not be explained in detail.

Those of ordinary skill in the art can recognize a resistor symbol, a capacitor symbol, an inductor symbol, and a MOST (metal-oxide semiconductor transistor) symbol, for both PMOST (p-channel metal-oxide semiconductor transistor) and NMOST (n-channel metal-oxide semiconductor transistor), and can identify a "source" terminal, a "gate" terminal, and a "drain" terminal of a MOST. For brevity, in this present disclosure, in a context of reference to a MOST, a "source terminal" is simply referred to as "source," a "gate terminal" is simply referred to as "gate," and a "drain terminal" is simply referred to as "drain."

Those of ordinary skills in the art can read schematics of a circuit comprising resistors, capacitors, inductors, NMOST, and PMOST, and do not need a verbose description about how one transistor, resistor, inductor, or capacitor connects with another in the schematics.

A cascode amplifier comprises a cascade of a common-source amplifier embodied by a first NMOST (n-channel metal oxide semiconductor transistor) and a common-gate amplifier embodied by a second NMOST; a source of the first NMOST connects to a ground node, thus embodying a common-source amplifier; a gate of the second NMOST connects to bias node of a fixed DC voltage, thus embodying a common-gate amplifier; the first NMOST converts an input voltage (received from its gate) into an internal current (output via its drain), whereas the second NMOST transports the internal current (received from its source) into an output current (output via its drain), resulting an output voltage across a load attached to a drain of the second NMOST. What is desired is that a change of the input voltage can lead to a proportional change of the output voltage. In practice, however, the change of the output voltage may not be proportional to the change of the input voltage, in particular when the change of the input voltage is large. This is inevitable because: first, a NMOST obeys a square law, wherein a drain current is approximately proportional to a square of a difference between a gate-to-source voltage and a threshold voltage; and second, the NMOST is subject to channel length modulation, wherein the drain current is modulated by a drain-to-source voltage.

What is desired is a cascode amplifier and method with improved linearity.

BRIEF SUMMARY OF THIS INVENTION

An objective of this present invention is to improve linearity of a cascode amplifier.

Another objective of this present invention is to allow a higher degree of freedom in designing a cascode amplifier to achieve a better linearity.

In an embodiment, a cascode amplifier comprises: a first common-source amplifier (CSA) comprising a first MOST (metal oxide semiconductor transistor) of a first type configured to receive a first input signal and output a first current to a first node; a first common-gate amplifier (CGA) comprising a second MOST of the first type and configured to receive the first current from the first node and output a second current to a second node in accordance with a first bias voltage; a first source-follower (SF) comprising a third MOST of a second type configured to receive a second input signal and output a first voltage at the first node; and a load configured to establish a third voltage at a third node in response to the second current through a DC (direct current) path between the second node and the third node, wherein: the second input signal is an inversion of the first input signal, a source of the first MOST of the first type and a drain of the third MOST of the second type connect to a first DC node, and the load comprises an inductor configured to provide DC coupling between the third node and a second DC node.

In an embodiment, a method comprises: receiving a first input signal and a second input signal that is an inversion of the first input signal; converting the first input signal into a first current directed to a first node using a first common-source amplifier (CSA) comprising a first MOST (metal oxide semiconductor transistor) of a first type, wherein a source, a gate, and a drain of the first MOST of the first type connect to a first DC (direct current) node, the first input signal, and the first node, respectively; transporting the first current into a second current directed to a second node using a first common-gate amplifier (CGA) comprising a second MOST of the first type, wherein a source, a gate, and a drain of the second MOST of the first type connect to the first node, a first bias node, and the second node, respectively; imposing the second input signal on a first voltage at the first node using a first source follower (SF) comprising a third MOST of a second type, wherein a source, a gate, and a drain of the third MOST of the second type connect to the first node, the second input signal, and the first DC (direct current) node, respectively; and establishing a third voltage at a third node by directing the second current to the third node through a DC path and terminating the third node with a load comprising an inductor configured to provide DC (direct current) coupling between the third node and a second DC node.

DETAILED DESCRIPTION OF THIS INVENTION

The present invention relates to cascode amplifiers. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Throughout this disclosure, "DC" stands for direct current, and "AC" stands for alternating current. A DC voltage refers to a substantially stationary voltage. An AC voltage refers to a voltage that varies with time in an oscillatory manner and is also referred to as a dynamic voltage. In general, a signal comprises a DC component and an AC component; the former is substantially stationary and remain fixed in a time duration of interest; and the latter is dynamic and can vary with time in a time duration of interest.

A DC node is a node of a substantially stationary voltage. Throughout this disclosure, "$V_{DD}$" denotes a first DC node referred to as a power node, and "$V_{SS}$" denotes a second DC node referred to as a ground node.

A common-source amplifier is embodied by a MOST configured to receive an input voltage from a gate and output an output current via a drain, wherein a source is connected to a DC node.

A common-gate amplifier is embodied by a MOST configured to receive an input current from a source and output an output current via a drain, wherein a gate is connected to a bias node, a voltage at which is equal to a bias voltage that is substantially stationary.

A cascode amplifier is a cascade of a common-source amplifier and a common-gate amplifier, wherein an output current of the common-source amplifier is an input current of the common-gate amplifier.

A source follower is embodied by a MOST configured to receive an input voltage at a gate and output an output voltage at a source, wherein a drain connects to a DC node or a circuit node of a sufficiently low impedance.

A circuit is a collection of a transistor, a capacitor, an inductor, a resistor, and/or other electronic devices interconnected in a certain manner to embody a certain function. A network is a circuit or a collection of circuits configured to embody a certain function.

In this present disclosure, a "circuit node" is simply referred to as a "node" for short, as the meaning is clear from a context of microelectronics and won't cause confusion.

In this present disclosure, a signal is a voltage of a variable level that can vary with time. A (voltage) level of a signal at a moment represents a state of the signal at that moment.

Figure 1:
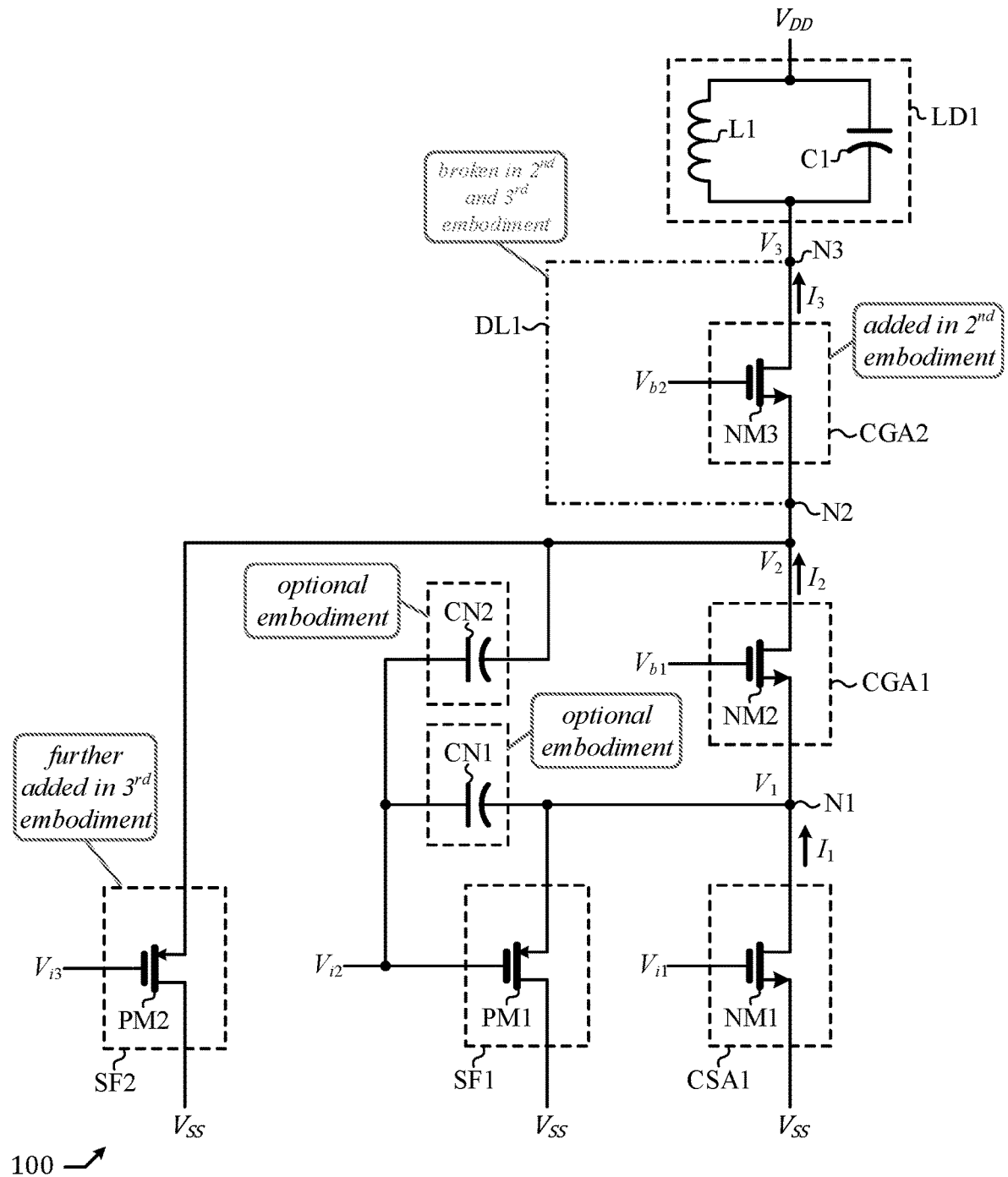
FIG. 1 shows a schematic diagram of a cascode amplifier in accordance with an embodiment of the present invention.

As shown in FIG. 1, a cascode amplifier 100 in accordance with an embodiment of the present disclosure comprises: a first common-source amplifier CSA1 comprising a first NMOST NM1 and configured to receive a first input signal $V_{i1}$ and output a first current $I_1$ to a first node N1; a first common-gate amplifier CGA1 comprising a second NMOST NM2 and configured to receive the first current $I_1$ via the first node N1 and output a second current $I_2$ to a second node N2 in accordance with a first bias voltage $V_{b1}$; a first source follower SF1 comprising a first PMOST PM1 and configured to receive a second input signal $V_{i2}$ and output a first voltage $V_1$ at the first node N1; and a first load LD1 comprising a parallel connection of a first inductor L1 and a first capacitor C1 and configured to establish a third voltage $V_3$, which is an output voltage of the cascode amplifier 100, at a third node N3 in response to the second current $I_2$ via a DC (direct current) path between the second node N2 and the third node N3. In a first embodiment of said DC path, dashed line DL1 is a solid connection between the second node N2 and the third node N3, so that N2 and N3 are electrically shorted and effectively become the same node. In a second embodiment of said DC path, dashed line DL1 is broken, a second common-gate amplifier CGA2 is added, inserted between the second node N2 and the third node N3, and configured to transport the second current $I_2$ into a third current $I_3$ directed to the third node N3. In a third embodiment that is an extension of the second embodiment, a second source follower SF2 comprising a second PMOST PM2 is further added and configured to receive a third input signal $V_{i3}$ and output a second voltage $V_2$ at the second node N2.

The first input signal $V_{i1}$ is a RF (radio frequency) voltage signal that can be mathematically modeled by the following equation:

$$V_{i1} = V_{dc1} + A(t)\sin(\omega t + \varphi(t)) \quad (1)$$

Here, $V_{dc1}$ denotes a first DC (direct current) voltage, $\omega$ denotes an angular frequency, t denotes a time variable, A(t) denotes an amplitude function of time, and $\varphi(t)$ denotes a phase function of time. Since $V_{i1}$ is a gate voltage of NM1, $V_{dc1}$ determines a biasing condition of CSA1. Note that $V_{dc1}$ is a DC component of $V_{i1}$, while $A(t)\sin(\omega t+\varphi(t))$ is an AC component of $V_{i1}$.

The second input signal $V_{i2}$ is a RF voltage signal that is an inversion of the first input signal $V_{i1}$ and can be mathematically modeled by the following equation:

$$V_{i2} = V_{dc2} - \alpha_2 A(t)\sin(\omega t + \varphi(t)) \quad (2)$$

Here, $V_{dc2}$ denotes a second DC voltage, and $\alpha_2$ is a scaling factor that is positive. In an embodiment, $\alpha_2 \approx 1$. It is clear from equations (1) and (2) that $V_{i2}$ is an inversion of $V_{i1}$, as far as an AC component is concerned. Since $V_{i2}$ is a gate voltage of PM1, $V_{dc2}$ determines a biasing condition of SF1.

The third input signal $V_{i3}$ is a RF voltage signal that is an inversion of the first input signal $V_{i1}$ and can be mathematically modeled by the following equation:

$$V_{i3} = V_{dc3} - \alpha_3 A(t)\sin(\omega t + \varphi(t)) \quad (3)$$

Here, $V_{dc3}$ denotes a third DC voltage, and $\alpha_3$ is a scaling factor that is positive. In an embodiment, $\alpha_3 \approx 1$. It is clear from equations (1) and (3) that $V_{i3}$ is an inversion of $V_{i1}$, as far as an AC component is concerned. Since $V_{i3}$ is a gate voltage of PM2, $V_{dc3}$ determines a biasing condition of SF2.

Consider the first embodiment, wherein CGA2 and SF2 are absent and DL1 is a solid connection. In this case, the cascode amplifier 100 is the same as a conventional cascode amplifier except for the addition of SF1, which is incorporated to complement CSA1. CSA1 is a voltage-to-current conversion circuit (converting $V_{i1}$ to $I_1$) and is subject to an inherent nonlinearity of NM1, particularly when A(t) is large. On the contrary, SF1 is a voltage-to-voltage conversion circuit and has increased linearity, because there is local negative feedback, wherein a larger source-to-gate voltage of PM1 will cause PM1 to draw a larger current from the first node N1 to lower down $V_1$ and thus reduce the source-to-gate voltage of PM1. Therefore, the cascode amplifier 100 can have a better linearity than a conventional cascode amplifier.

In the second embodiment, CGA2 is added to enhance a reverse isolation and mitigate a kickback from N3 to N2.

In the third embodiment, SF2 is added to further enhance linearity.

In an optional embodiment, the cascode amplifier 100 further comprises a first neutralization capacitor CN1 configured to directly couple $V_{i2}$ to $V_1$. Capacitive coupling is inherently linear; therefore, this can improve linearity.

In another optional embodiment, the cascode amplifier 100 further comprises a second neutralization capacitor CN2 configured to directly couple $V_{i2}$ to $V_2$. Capacitive coupling is inherently linear; therefore, this can improve linearity.

Figure 2:
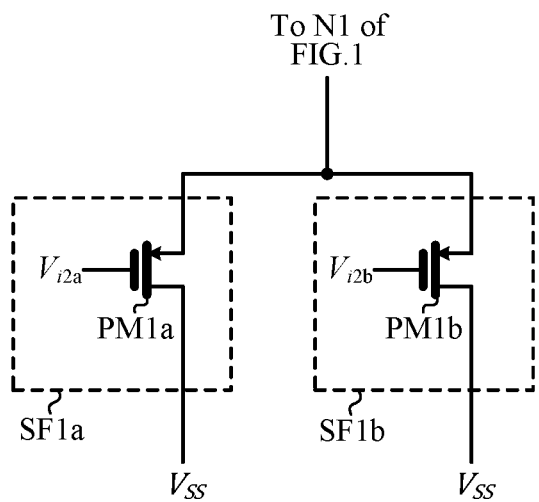
FIG. 2 shows a schematic diagram of a distributed source follower.

In an alternative embodiment, SF1 is replaced with a distributed source follower DSF1 shown in FIG. 2. DSF1 comprises a parallel connection of a plurality of source followers; by way of example but not limitation, two source followers SF1a and SF1b embodied by PMOST PM1a and PM1b, respectively, are shown in FIG. 2. When using DSF1 to replace SF1, the second input signal $V_{i2}$ received by SF1 is replaced by $V_{i2a}$ and $V_{i2b}$ received by SF1a and SF1b, respectively. $V_{i2a}$ and $V_{i2b}$ can be mathematically modeled by the following two equations:

$$V_{i2a} = V_{dc2a} - \alpha_{2a}A(t)\sin(\omega t + \varphi(t)) \quad (4)$$

$$V_{i2b} = V_{dc2b} - \alpha_{2b}A(t)\sin(\omega t + \varphi(t)) \quad (5)$$

Figure 3:
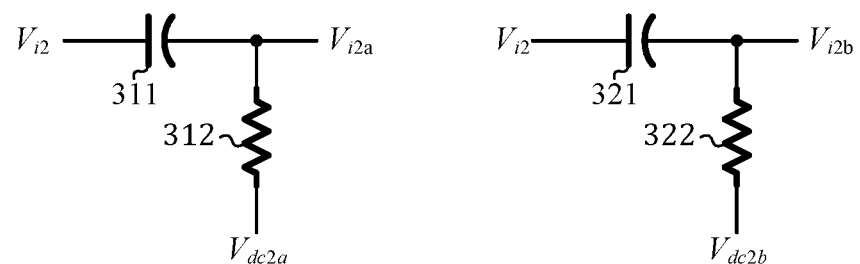
FIG. 3 shows a schematic diagram of an AC coupling network for the distributed source follower of FIG. 2.

Here, $V_{dc2a}$ and $V_{dc2b}$ denote two DC voltages, and $\alpha_{2a}$ and $\alpha_{2b}$ denote two scaling factors that are positive. In an embodiment, $\alpha_{2a} \approx 1$ and $\alpha_{2b} \approx 1$. Note that in SF1, $V_{dc2}$ determines a bias condition of PM1; in DSF1, on the other hand, $V_{dc2a}$ and $V_{dc2b}$ determine a bias condition of PM1a and PM1b, respectively. An advantage of using DSF1 to replace SF1 is that there is a higher degree of freedom in circuit design, as PM1a and PM1b can be biased in different bias conditions to allow DSF1 to remain at least partly turned on over a wider range of the amplitude function A(t) and thus improve linearity. In an embodiment, $V_{i2a}$ and $V_{i2b}$ are derived from $V_{i2}$ using an AC (alternating current) coupling network ACCN1 shown in FIG. 3. ACCN1 comprises capacitors 311 and 321 configured to provide AC coupling from $V_{i2}$ to $V_{i2a}$ and $V_{i2b}$, respectively, and two resistors 312 and 322 configured to provide DC (direct current) coupling from $V_{dc2a}$ and $V_{dc2b}$ to $V_{i2a}$ and $V_{i2b}$, respectively. Those skilled in the art may freely opt to use other AC coupling schemes, e.g., by using transformer, to fulfill AC coupling function to establish DC voltages of $V_{i2a}$ and $V_{i2b}$ at their discretion. In any case, a DC component of a signal can be altered while at the same time an AC component of the signal can remain substantially intact using an AC coupling scheme chosen by those skilled in the art at their discretion.

Similarly, SF2 may be replaced by a distributed source follower like DSF1, which will be obvious to those of ordinary skill in the art and thus not explained in detail here.

Figure 4:
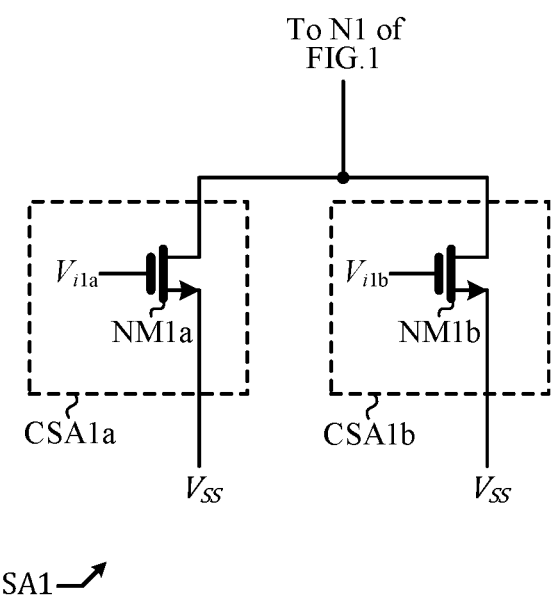
FIG. 4 shows a schematic diagram of a distributed common-source amplifier.

In an alternative embodiment, CSA1 is replaced with a distributed common-source amplifier DCSA1 shown in FIG. 4. DCSA1 comprises a parallel connection of a plurality of common-source amplifiers; by way of example but not limitation, two common-source amplifiers CSA1a and CSA1b embodied by NMOST NM1a and NM1b, respectively, are shown in FIG. 4. When using DCSA1 to replace CSA1, the first input signal $V_{i1}$ received by CSA1 is replaced by $V_{i1a}$ and $V_{i1b}$ received by CSA1a and CSA1b, respectively. $V_{i1a}$ and $V_{i1b}$ can be mathematically modeled by the following two equations:

$$V_{i1a} = V_{dc1a} + \alpha_{1a}A(t)\sin(\omega t + \varphi(t)) \quad (6)$$

$$V_{i1b} = V_{dc1b} + \alpha_{1b}A(t)\sin(\omega t + \varphi(t)) \quad (7)$$

Here, V_dc1a and V_dc1b denote two DC voltages, and $\alpha\_1a$ and $\alpha\_1b$ denote two scaling factors that are positive. In an embodiment, $\alpha\_1a \approx 1$ and $\alpha\_1b \approx 1$. Note that in CSA1, V_dc1 determines a bias condition of NM1; in DCSA1, on the other hand, V_dc1a and V_dc1b determine a bias condition of NM1a and NM1b, respectively. An advantage of using DCSA1 to replace CSA1 is that there is a higher degree of freedom in circuit design, as NM1a and NM1b can be biased in different bias conditions to allow DCSA1 to remain at least partly turned on over a wider range of the amplitude function A (t) and thus improve linearity. In an embodiment, V_i1a and V_i1b are derived from V_i1 using an AC (alternating current) coupling network in the same way as that V_i2a and V_i2b are derived from V_i2 using an AC (alternating current) coupling network ACCN1 of FIG. 3; this is obvious to those of ordinary skill in the art and thus not described in detail here. Again, those skilled in the art can freely opt to use other AC coupling schemes, e.g., by using transformer, to fulfill AC coupling function to establish DC voltages of V_i1a and V_i1b for at their discretion.

The cascode amplifier 100 shown in FIG. 1 is a single-ended circuit embodiment; this is merely an example but not limitation. By adding a replica copy of the cascode amplifier 100 and applying respective complementary input signals (wherein a DC component is the same, while an AC component is inverted), one can construct a differential circuit embodiment. This will be obvious to those of ordinary skill in the art and thus not described in detail.

Now refer to FIG. 1. A purpose of the first capacitor C1 is to form a resonance with the first inductor L1 at the angular frequency $\omega$. However, C1 is optional and may not be needed if a parasitic capacitance at the third node N3 is readily adequate to form the resonance with the first inductor L1.

For any given circuit comprising NMOST and/or PMOST, a function of said circuit remains the same if every NMOST is replaced with a PMOST, every PMOST is replaced with a NMOST, every power supply node is replaced with a ground node, and every ground node is replaced with a power supply node; in other words, NMOST and PMOST are swapped, and power supply node and ground node are also swapped. Therefore, in the appended claims, NMOST and PMOST are not explicitly stated; instead, "MOST of a first type" and "MOST of a second type" are stated; in one embodiment, "MOST of a first type" and "MOST of a second type" refer to NMOST and PMOST, respectively; in another embodiment, "MOST of a first type" and "MOST of a second type" refer to PMOST and NMOST, respectively. Likewise, power supply node and ground node are not explicitly stated; instead, "a first DC node" and "a second DC node" are used.

Figure 5:
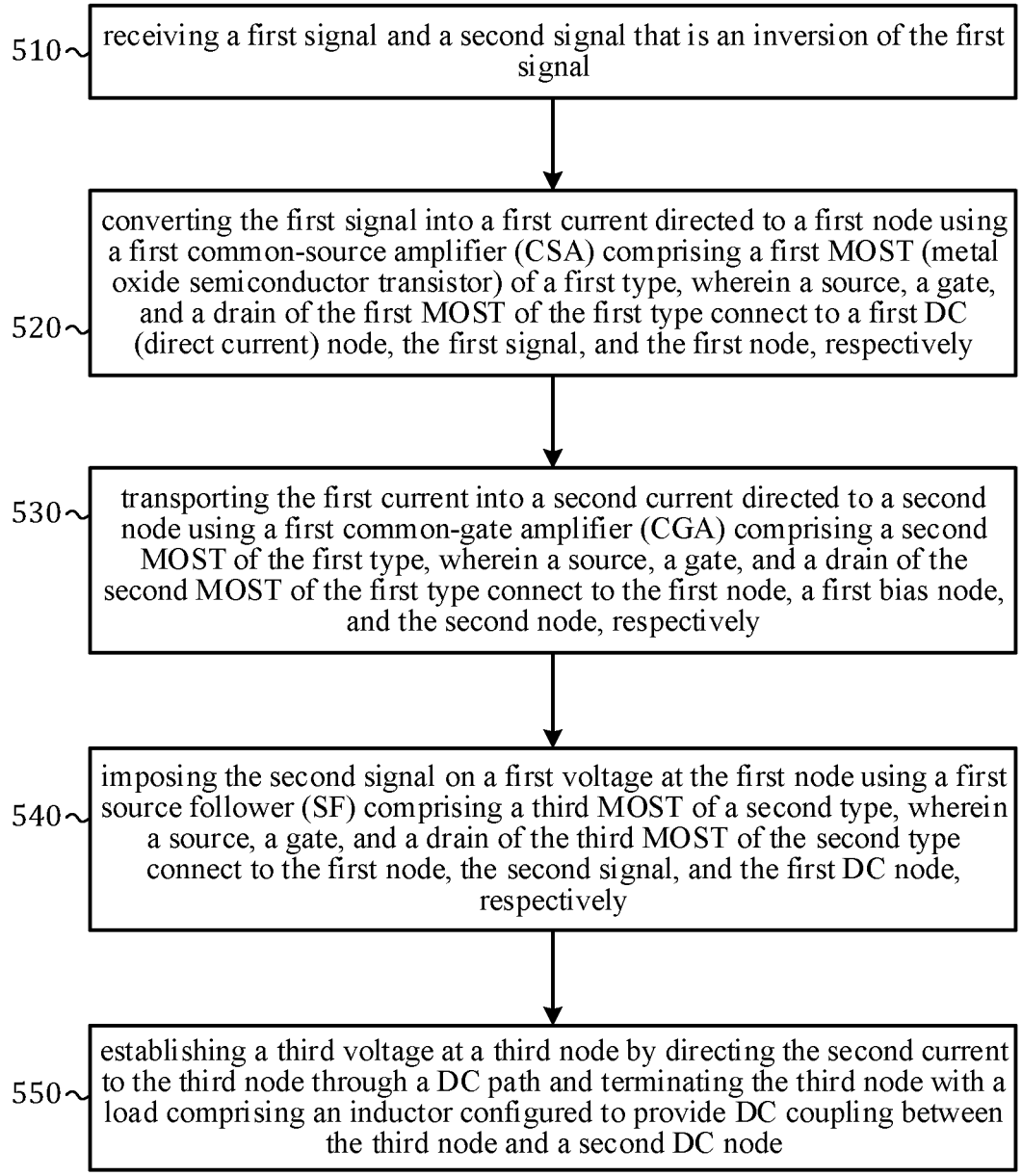
FIG. 5 shows a flow diagram of a method in accordance with the present invention.

As shown in a flow diagram shown in FIG. 5, a method in accordance with an embodiment of the present disclosure comprises: (step 510) receiving a first signal and a second signal that is an inversion of the first signal; (step 520) converting the first signal into a first current directed to a first node using a first common-source amplifier (CSA) comprising a first MOST (metal oxide semiconductor transistor) of a first type, wherein a source, a gate, and a drain of the first MOST of the first type connect to a first DC (direct current) node, the first signal, and the first node, respectively; (step 530) transporting the first current into a second current directed to a second node using a first common-gate amplifier (CGA) comprising a second MOST of the first type, wherein a source, a gate, and a drain of the second MOST of the first type connect to the first node, a first bias node, and the second node, respectively; (step 540) imposing the second signal on a first voltage at the first node using a first source follower (SF) comprising a third MOST of a second type, wherein a source, a gate, and a drain of the third MOST of the second type connect to the first node, the second signal, and the first DC node, respectively; and (step 550) establishing a third voltage at a third node by directing the second current to the third node through a DC (direct current) path and terminating the third node with a load comprising an inductor configured to provide DC (direct current) coupling between the third node and a second DC node.

Those skilled in the art will readily observe that numerous modifications and alterations of the device and method may be made within the scope and spirit of the invention. Accordingly, the above disclosure should not be construed as limited only by the metes and bounds of the appended claims.

What is claimed is:

1. A cascode amplifier comprises:
   a first common-source amplifier (CSA) comprising a first MOST (metal oxide semiconductor transistor) of a first type and configured to receive a first signal and output a first current to a first node;
   a first common-gate amplifier (CGA) comprising a second MOST of the first type configured to receive the first current from the first node and output a second current to a second node in accordance with a first bias voltage;
   a first source-follower (SF) comprising a third MOST of a second type configured to receive a second signal and impose on a first voltage at the first node; and
   a load configured to establish a third voltage at a third node in response to the second current via a DC (direct current) path between the second node and the third node, wherein: the second signal is an inversion of the first signal, a source of the first MOST connects to a first DC node, and the load comprises an inductor configured to provide DC coupling between the third node and a second DC node.

2. The cascode amplifier of claim 1 further comprising a first neutralization capacitor configured to couple the second signal to the first node.

3. The cascode amplifier of claim 1, wherein the DC path comprises a short circuit inserted between the second node and the third node.

4. The cascode amplifier of claim 1, wherein the DC path comprises a second CGA comprising a fourth MOST of the first type and configured to transport the second current into a third current directed to the third node in accordance with a second bias voltage.

5. The cascode amplifier of claim 4 further comprising a second neutralization capacitor configured to couple the second signal to the second node.

6. The cascode amplifier of claim 4 further comprising a second SF comprising a fifth MOST of the second type and configured to receive a third signal and impose a second voltage at the second node, wherein the third signal is the inversion of the first signal.

7. The cascode amplifier of claim 1 further comprising an additional CSA comprising an additional MOST of the first type and configured to receive an additional signal and output an additional current to the first node, wherein a source of the additional MOST connects to the first DC node, and an AC (alternating current) component of the additional signal is approximately equal to an AC component of the first signal.

8. The cascode amplifier of claim 7, wherein the additional signal is AC coupled to the first signal via an AC coupling network configured to allow the additional signal and the first signal to have approximately the same AC components but different DC components.

9. The cascode amplifier of claim 1 further comprising an additional SF comprising an additional MOST of the second type and configured to receive an additional signal and along with the third MOST of the second type jointly impose on the first voltage at the first node, wherein a drain of the additional MOST of the second type connects to the first DC node, and an AC component of the additional signal is approximately equal to an AC component of the second signal.

10. The cascode amplifier of claim 9, wherein the additional signal is AC coupled to the second signal via an AC coupling network configured to allow the additional signal and the second signal to have approximately the same AC components but different DC components.

11. A method comprising the following steps:
    receiving a first signal and a second signal that is an inversion of the first signal;
    converting the first signal into a first current directed to a first node using a first common-source amplifier (CSA) comprising a first MOST (metal oxide semiconductor transistor) of a first type, wherein a source, a gate, and a drain of the first MOST of the first type connect to a first DC (direct current) node, the first signal, and the first node, respectively;
    transporting the first current into a second current directed to a second node using a first common-gate amplifier (CGA) comprising a second MOST of the first type, wherein a source, a gate, and a drain of the second MOST of the first type connect to the first node, a first bias node, and the second node, respectively;
    imposing the second signal on a first voltage at the first node using a first source follower (SF) comprising a third MOST of a second type, wherein a source, a gate, and a drain of the third MOST of the second type connect to the first node, the second signal, and the first DC (direct current) node, respectively; and
    establishing a third voltage at a third node by directing the second current to the third node through a DC path and terminating the third node with a load comprising an inductor configured to provide DC coupling between the third node and a second DC node.

12. The method of claim 11 further comprising coupling the second signal to the first node using a first neutralization capacitor.

13. The method of claim 11, wherein the DC path comprises a short circuit inserted between the second node and the third node.

14. The method of claim 11 further comprising transporting the second current into a third current directed to the third node in accordance with a second bias voltage using a second CGA comprising a fourth MOST of the first type.

15. The method of claim 14 further comprising coupling the second signal to the second node using a second neutralization capacitor.

16. The method of claim 14 further comprising imposing a third signal on a second voltage at the second node using a second SF comprising a fifth MOST of the second type, wherein the third signal is an inversion of the first signal.

17. The method of claim 11 further comprising converting an additional signal into an additional current directed to the first node using an additional CSA comprising an additional MOST of the first type, wherein a source, a gate, and a drain of the additional MOST connect to the first DC node, an additional input signal, and the first node, respectively, and an AC (alternating current) component of the additional signal is approximately equal to an AC component of the first signal.

18. The method of claim 17, wherein the additional signal is AC coupled to the first signal via an AC coupling network configured to allow the additional signal and the first signal to have approximately the same AC components but different DC components.

19. The method of claim 11 further comprising imposing an additional signal on the first voltage using an additional SF comprising an additional MOST of the second type, wherein a source, a gate, and a drain of the additional MOST connect to the first node, the additional signal, and the first DC node, respectively, and an AC component of the additional signal is approximately equal to an AC component of the second signal.

20. The method of claim 19, wherein the additional signal is AC coupled to the second signal via an AC coupling network configured to allow the additional signal and the second signal to have approximately the same AC components but different DC components.

* * * * *